(12) United States Patent
Wu (10) Patent No.: US 7,985,002 B2
(45) Date of Patent: Jul. 26, 2011

(54) ILLUMINANT DEVICE AND MANUFACTURING METHOD THEREOF

(75) Inventor: Hsiang-Chen Wu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 238 days.

(21) Appl. No.: 12/175,946

(22) Filed: Jul. 18, 2008

(65) Prior Publication Data

US 2009/0262544 A1 Oct. 22, 2009

(30) Foreign Application Priority Data

Apr. 18, 2008 (TW) .............................. 97114117 A (51) Int. Cl.
*F21V 21/00* (2006.01)
(52) U.S. Cl. ............... 362/249.02; 362/249.01; 362/545
(58) Field of Classification Search ............. 362/249.01, 362/249.02, 459, 543, 544, 545
See application file for complete search history.

(56) References Cited

U.S. PATENT DOCUMENTS

| | | | | |
|---|---|---|---|---|
| 5,404,282 | A * | 4/1995 | Klinke et al. | 362/249.06 |
| 5,567,036 | A * | 10/1996 | Theobald et al. | 362/485 |
| 6,345,902 | B2 * | 2/2002 | Ohkohdo et al. | 362/549 |
| 7,290,911 | B2 * | 11/2007 | Tsukamoto et al. | 362/543 |
| 7,399,105 | B2 * | 7/2008 | Southard et al. | 362/391 |

* cited by examiner

*Primary Examiner* — John A Ward
(74) *Attorney, Agent, or Firm* — Muncy, Geissler, Olds & Lowe, PLLCDE (57) ABSTRACT

An illuminant device and a manufacturing method thereof. The manufacturing method includes the following steps of providing a body with a plurality of connecting members, disposing a plurality of lamps on the connecting members, respectively, dividing the body with the lamps into a plurality of assembling units, installing the assembling units on a carrier, and assembling the carrier with a holder.

18 Claims, 9 Drawing Sheets

ILLUMINANT DEVICE AND MANUFACTURING METHOD THEREOF

CROSS REFERENCE TO RELATED APPLICATIONS

This Non-provisional application claims priority under 35 U.S.C. §119(a) on Patent Application No(s). 097114117 filed in Taiwan, Republic of China on Apr. 18, 2008, the entire contents of which are hereby incorporated by reference.

BACKGROUND OF THE INVENTION

1. Field of Invention

The present invention relates to an illuminant device and, in particular, to an illuminant device with a stereo lamp structure.

2. Related Art

Figure 1:
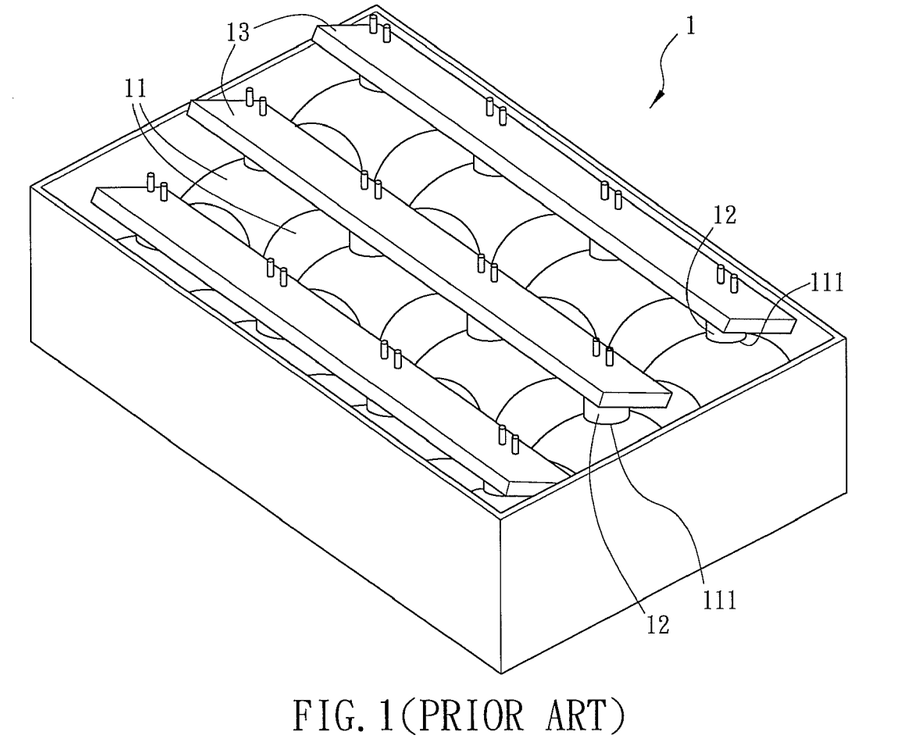
FIG. 1 is a schematic illustration showing a conventional vehicle lamp device.

As shown in FIG. 1, a conventional vehicle lamp device 1 includes several rows of light converging holders 11, light-emitting diodes (LEDs) 12 and circuit boards 13. The light converging holders 11 have a stepped arrangement. The LEDs 12 are inserted and welded on the circuit boards 13 in advance, and the arrangement of the LEDs 12 corresponds to the structure of the light converging holders 11. Then, the LEDs 12 are inserted into the holes of the light converging holders 11. However, the insertion depth of the leads of the LED 12 into the circuit board 13 can not be controlled precisely, so that the height of the welded LED 12 may not match the predetermined value. Therefore, when the circuit board 13 and the light converging holder 11 are assembled, some LEDs may be inserted into the light converging holder 11 but the others may not. Accordingly, the heights of the LEDs 12 may not be leveled with the light converging holder 11.

Figure 2:
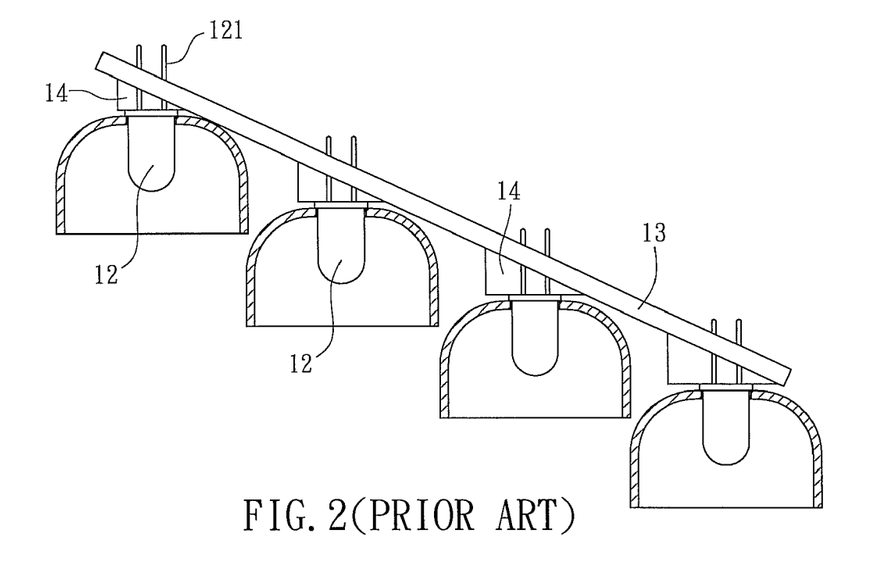
FIG. 2 is a sectional view of another conventional vehicle lamp device.

To solve the above-mentioned problem, several beveled washers 14 are added, as shown in FIG. 2, for controlling the insertion depth of the leads 121 of the LED 12 into the circuit board 13. However, this method increases the manufacturing cost and total component number due to the additional beveled washers 14.

SUMMARY OF THE INVENTION

In view of the above, an object of the invention is to provide a manufacturing method of an illuminant device. The manufacturing method includes the steps of providing a body with a plurality of connecting members, disposing a plurality of lamps on the connecting members, respectively, dividing the body with the lamps into a plurality of assembling units, installing the assembling units on a carrier, and assembling the carrier with holder.

Preferably, the connecting member is a circuit board, a metal plate or a conductive plate.

Preferably, the lamp is a tubular, circular or rectangular light-emitting diode (LED), such as a lamp type LED, a Piranha LED, a Snap LED or a SMD-type LED.

In addition, the lamp has a lead and a protrusion, which is directly formed on the lead or formed by bending the lead. A distance is provided between the protrusion and an end portion of the lead for controlling an insertion depth of the lamp into the connecting member.

Preferably, the carrier is a circuit board, which has a flat structure.

Preferably, a connecting surface of the connecting member connecting with the carrier is a copper-clad surface.

The carrier and the holder are assembled by a first fixing element. The first fixing element comprises at least one fixing pin and at least one fixing hole. The first fixing element is preferably a rectangular body. In addition, the holder includes a second fixing element disposed opposite to and assembled with the first fixing element. The second fixing element can be a cylindrical body or a cone body.

The lamp is fixed on the connecting member by a wave soldering process.

Preferably, the holder is a bowl-shaped, semicircular, half-ellipse or square-pyramid structure for converging light. The holder has a hole for positioning the lamp.

In addition, to achieve the above object, the invention discloses an illuminant device including a body, a plurality of lamps, a carrier and a holder. The body has a plurality of connecting members, and the lamps are disposed on the connecting members, respectively. The body is divided into a plurality of assembling units, and each assembling unit includes one lamp and one connecting member. The assembling units are installed on the carrier, and the holder is assembled with the carrier.

Preferably, the illuminant device can be a vehicle lamp device.

Preferably, the illuminant device further includes a housing for accommodating the holder.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

An illuminant device according to the present invention includes a body, a plurality of lamps, a carrier and a holder. The body has a plurality of connecting members, and the lamps are disposed on the connecting members, respectively. The body is divided into a plurality of assembling units, and each assembling unit includes one lamp and one connecting member. The assembling units are installed on the carrier, and the holder is assembled with the carrier. The illuminant device of the present invention can be a vehicle lamp device. In the following description, the lamp is, for example but not limited to, a light-emitting diode (LED).

A manufacturing method of an illuminant device according to an embodiment of the present will be described herein below with reference to FIGS. 3 to 7. In the following description, the connecting member of the present invention is, for example but not limited to, a common circuit board. Of course, the connecting member can be a metal plate or a conductive plate.

Figure 3:
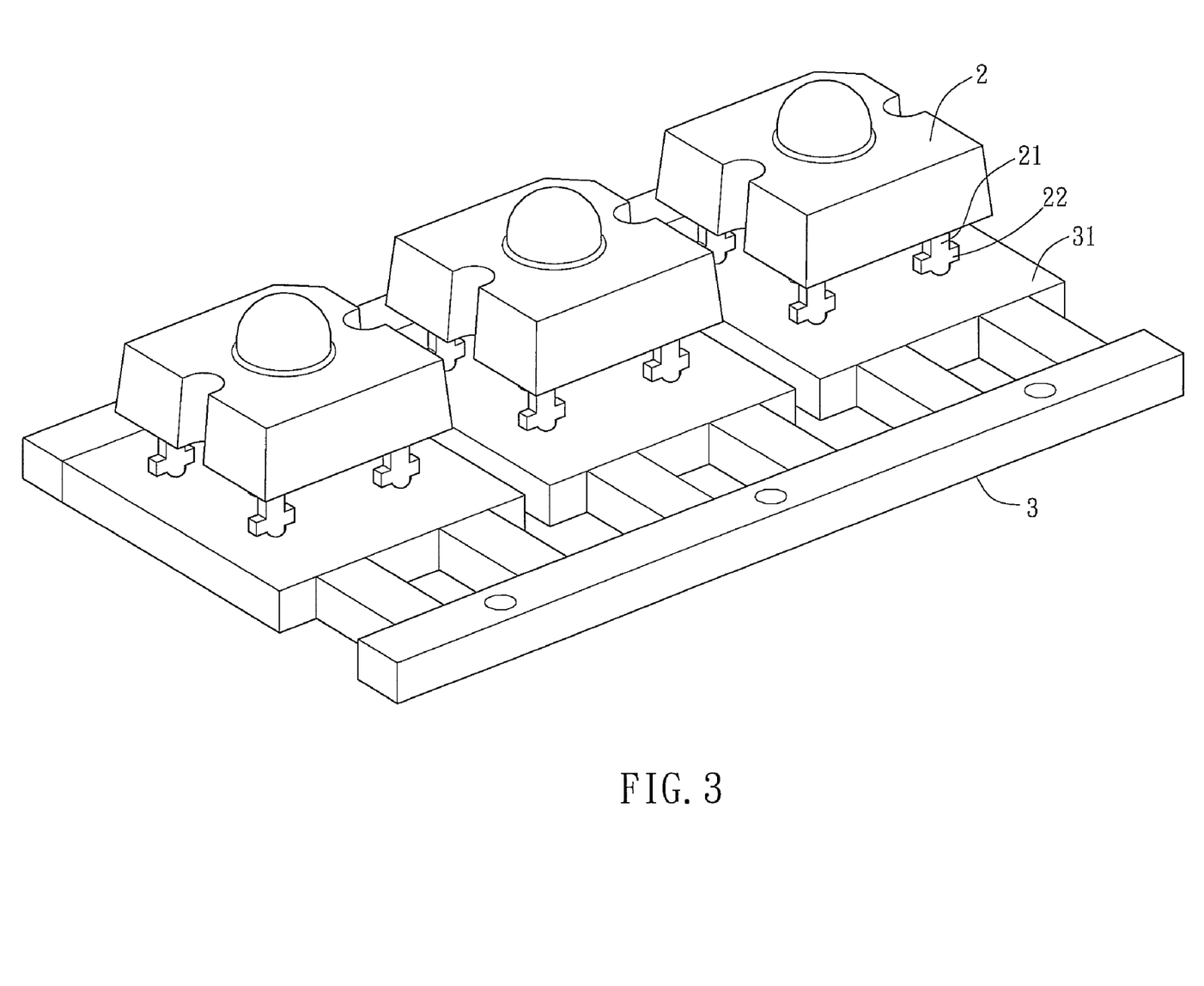
FIG. 3 is an assembling illustration of a plurality of LEDs and a body with a plurality of circuit boards according to an embodiment of the present invention.
Figure 4:
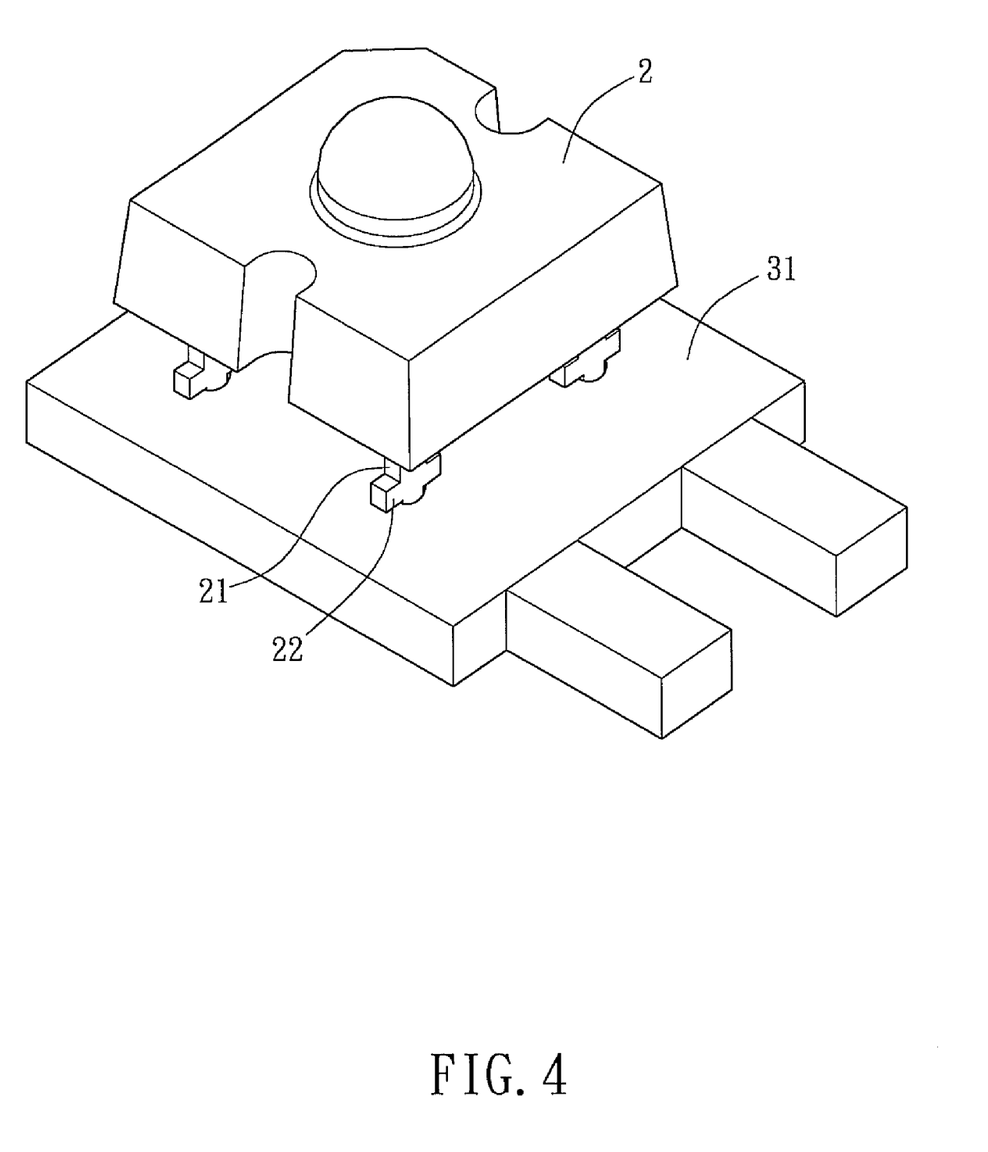
FIG. 4 is a schematic illustration showing an assembling unit including one LED and one circuit board as shown in FIG. 3.

As shown in FIG. 3, a plurality of LEDs 2 are inserted into a body 3, which has a plurality of smaller circuit boards 31. Then, the body 3 passes through a wave soldering machine, and a plurality of assembling units, each of which is composed of one LED 2 and one circuit board 31, are obtained as shown in FIG. 4. The lead 21 of the LED 2 has a protrusion 22, which can be directly formed on the lead 21 or formed by bending the lead 21. A distance is provided between the protrusion 22 and an end portion of the lead 21 for controlling an insertion depth of the LED 2 into the circuit board 31.

Figure 5:
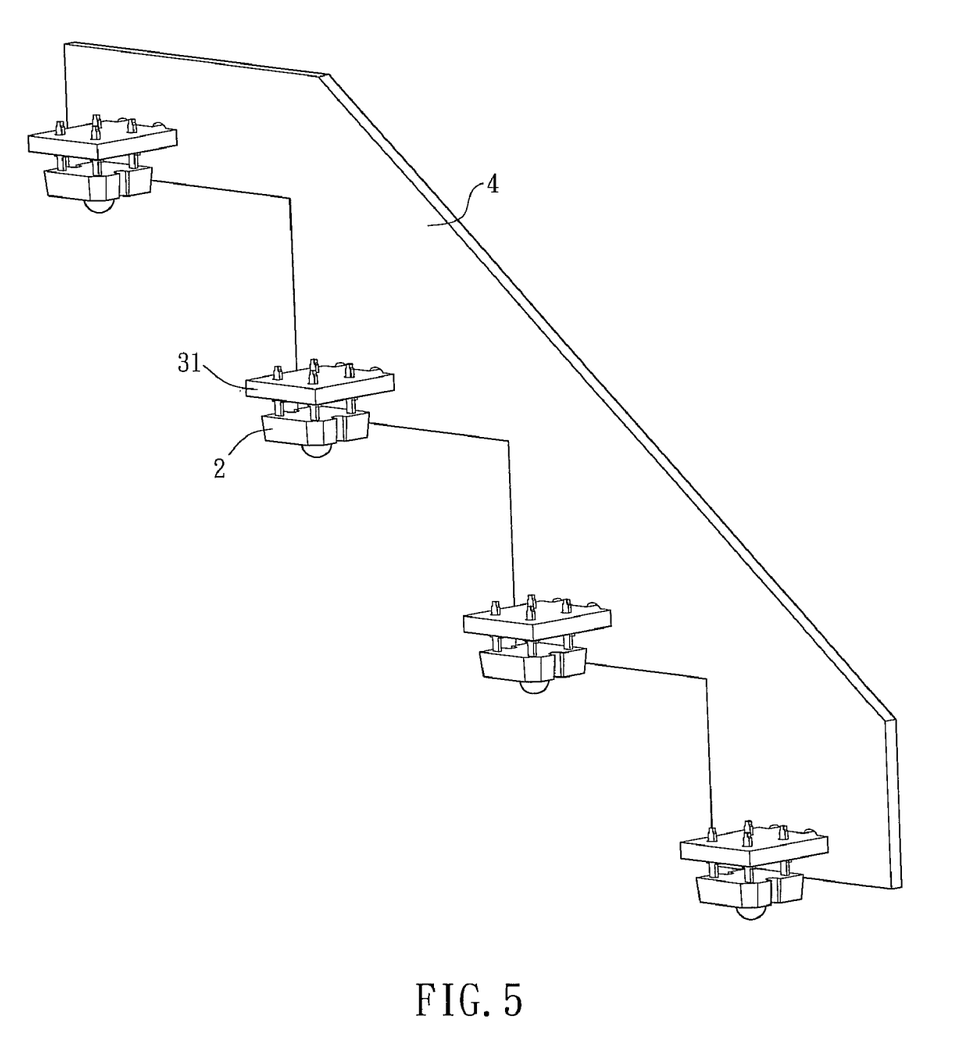
FIG. 5 is an assembling illustration of a carrier and a plurality of assembling units as shown in FIG. 4.
Figure 6:
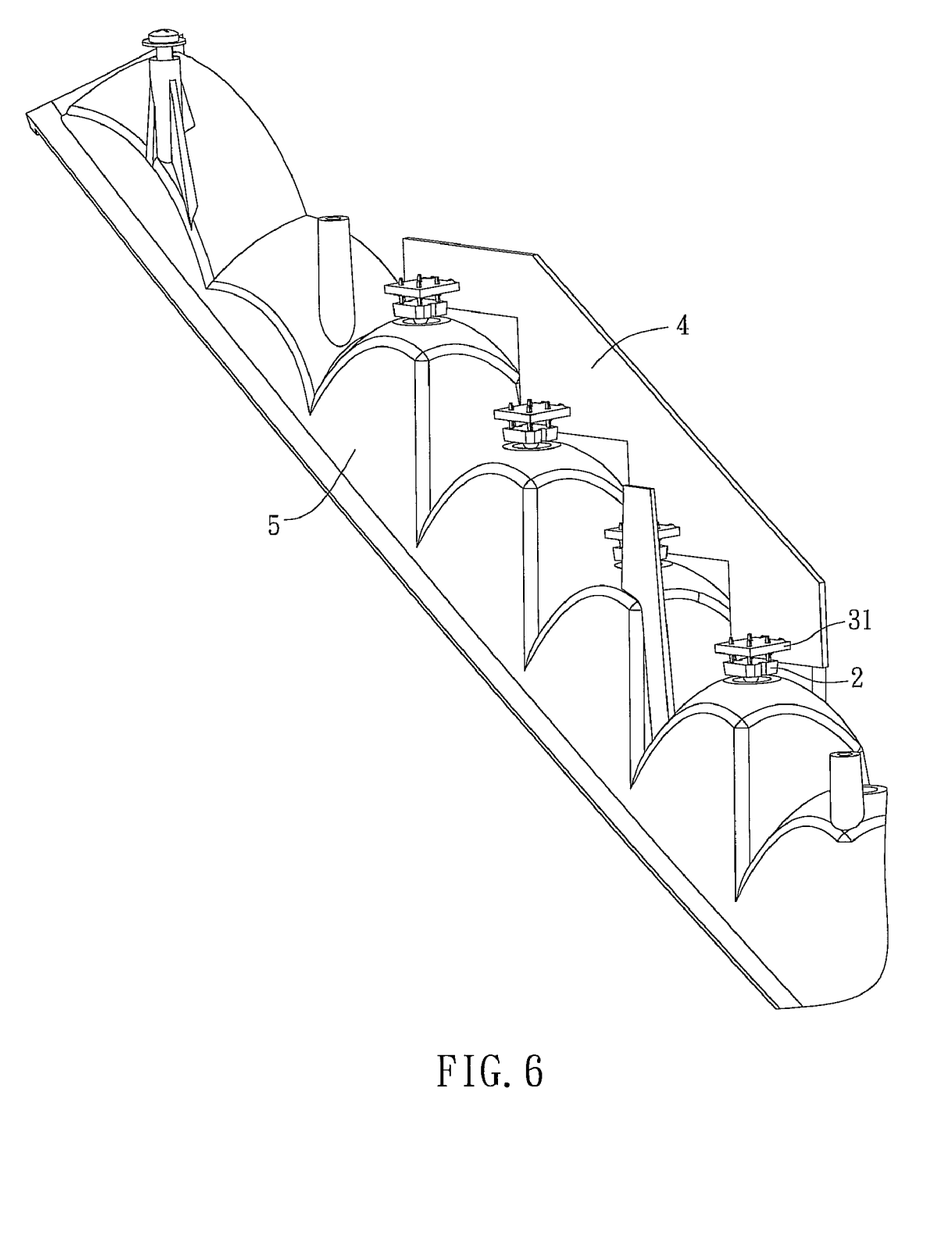
FIG. 6 is a schematic illustration showing a part of a holder assembled with the carrier and assembling units as shown in FIG. 5.

The assembling units are inserted into a larger circuit board 4 as a carrier. After a wave soldering process, a component including the LEDs 2, circuit boards 31 and circuit board 4 can be manufactured as shown in FIG. 5. The connecting surface of the circuit board 31 connecting with the circuit board 4 is a copper-clad surface, and the carrier (the circuit board 4) has a flat structure. Then, the above-mentioned component and a plurality of holders 5 are properly assembled and fixed so as to form the stereo lamp structure as shown in FIG. 6.

Since the circuit boards 31 are configured on the body 3 in order, the LEDs 2 can be easily inserted into the circuit boards 31 by auto insertion method. Then, the wave soldering process can be performed to sufficiently and stably fix the LEDs 2 on the circuit boards 31. In addition, the shapes of the circuit boards 31 and 4 can be easily changed by the fast and cheap circuit board manufacturing process, and thus various kinds of stereo lamp structures can be manufactured.

Figure 7:
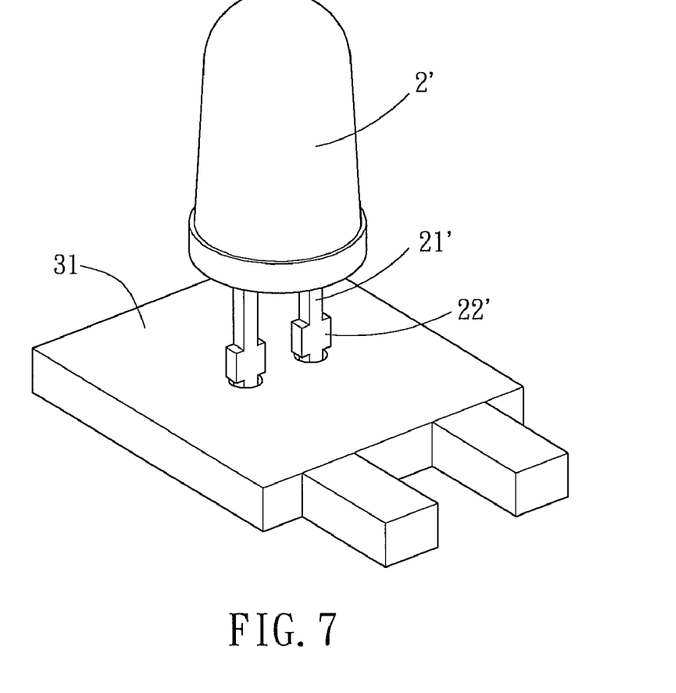
FIGS. 7 and 8 are schematic illustrations showing different aspects of lamps of the illuminant device according to the embodiment of the present invention.
Figure 8:
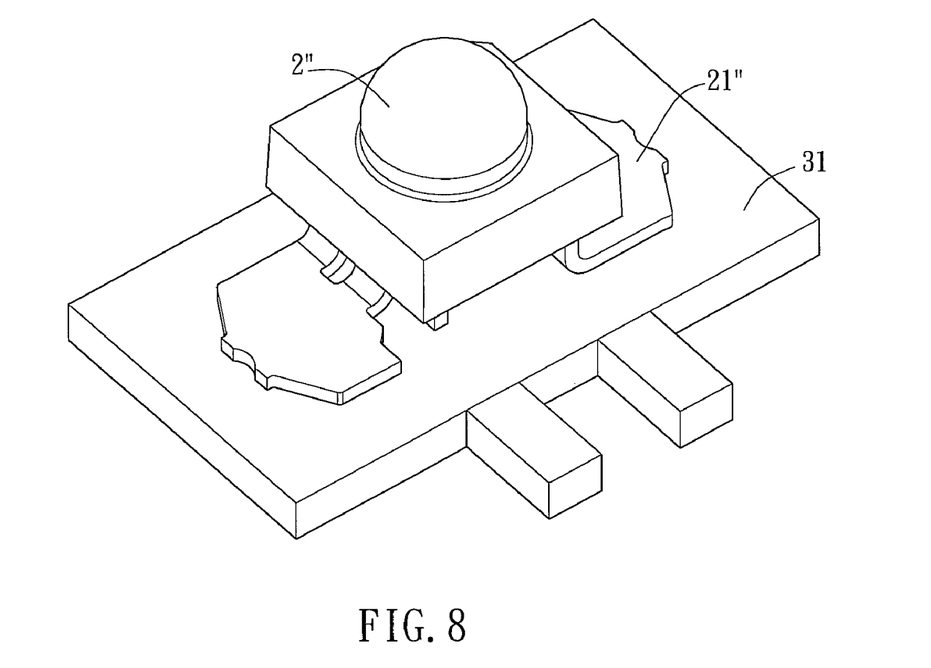

Excepting the above-mentioned rectangular LED, a lamp type LED 2' as shown in FIG. 7 can also be used. The lead 21' of the LED 2' also has a protrusion 22'. Alternatively, as shown in FIG. 8, an SMD type LED 2", which has flat leads 21", can be used.

Figure 9:
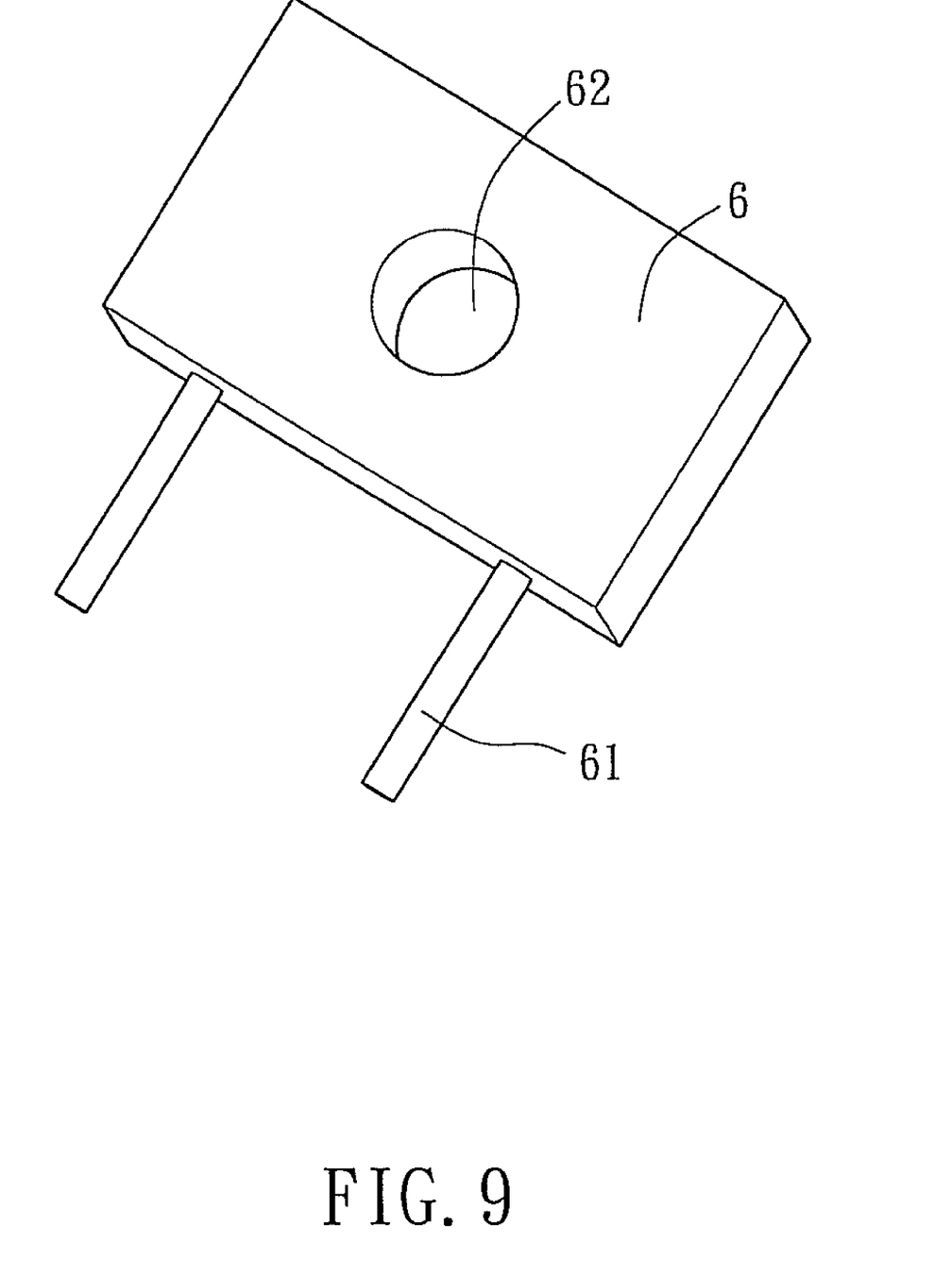
FIG. 9 is a schematic illustration showing a first fixing element for fixing the carrier and assembling units as shown in FIG. 5 on the holder.
Figure 10:
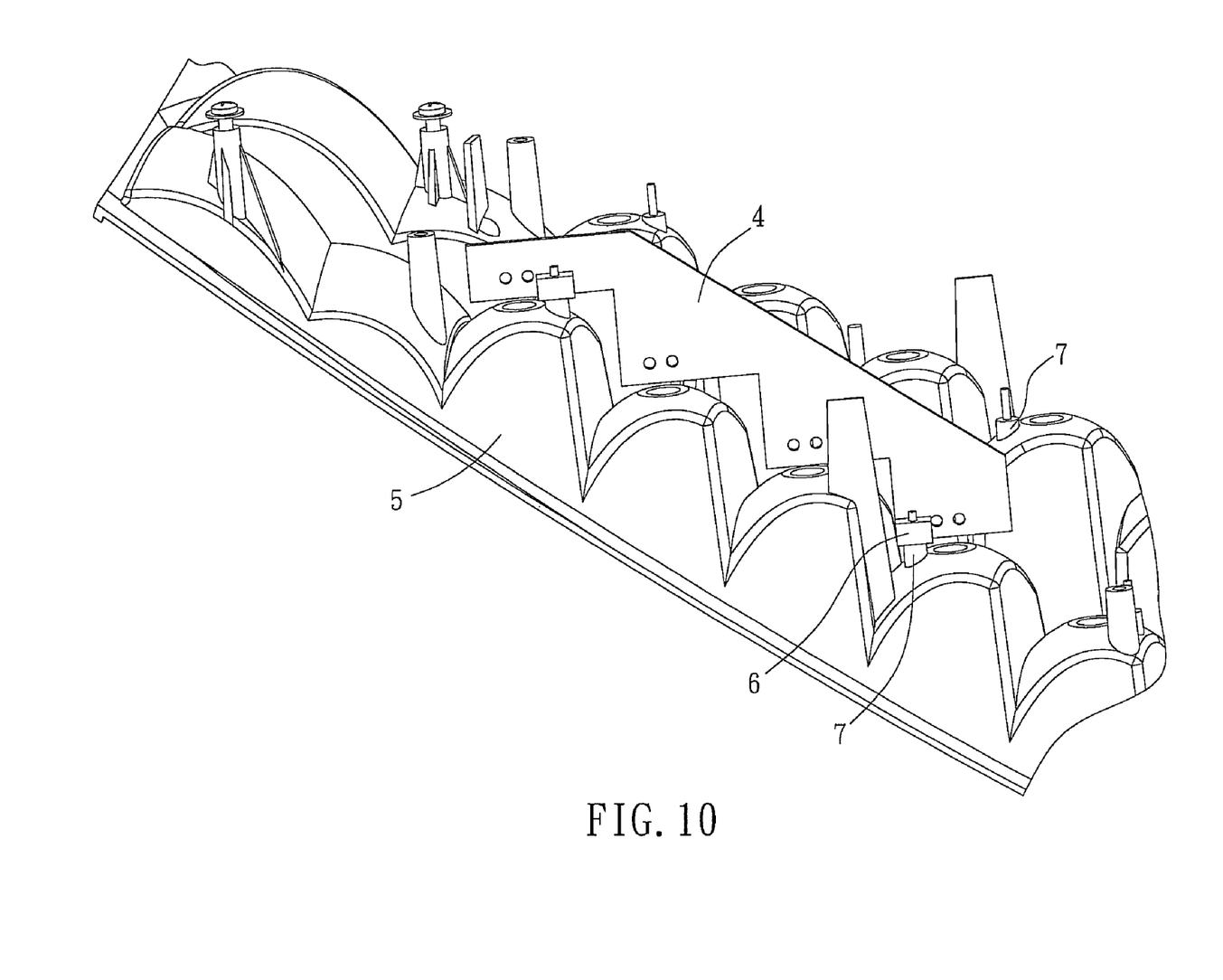
FIG. 10 is a partial back view of the illuminant device according to the embodiment of the present invention.

Furthermore, the component including the LEDs 2, circuit boards 31 and circuit board 4 as shown in FIG. 5 can be fixed on the holder 5 by a first fixing element 6. The first fixing element 6 includes at least one fixing pin 61 and a fixing hole 62 as shown in FIG. 9. The first fixing element 6 can be a rectangular body, and the fixing pins 61 are inserted into the circuit board 4. The first fixing element 6 as well as the circuit boards 31 can be inserted into the circuit board 4, and then fixed on the carrier (the circuit board 4) by the wave soldering process, as shown in FIG. 10.

Figure 11:
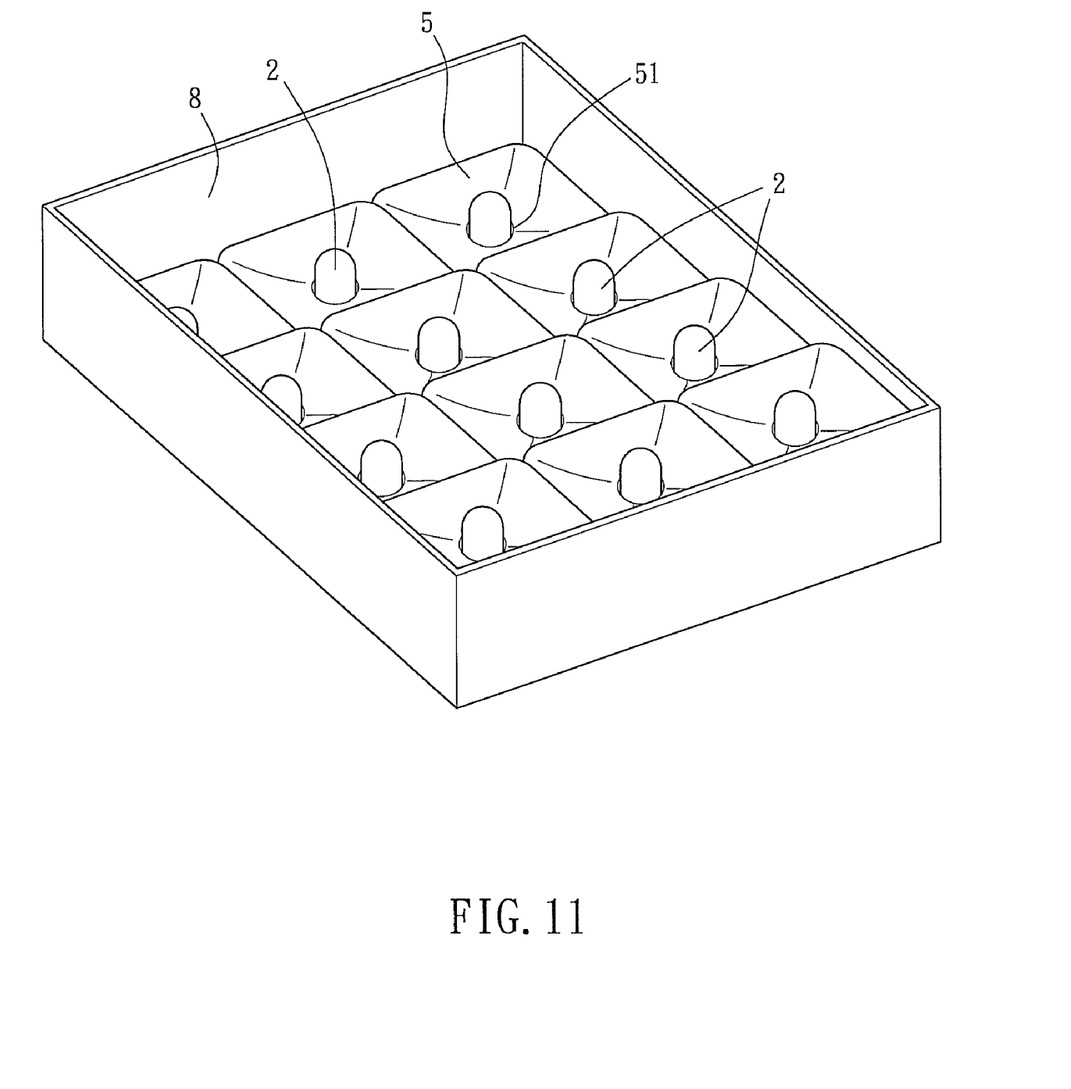
FIG. 11 is a front view of the illuminant device according to the embodiment of the present invention.

In addition, the holder 5 includes a second fixing element 7 disposed opposite to the first fixing element 6. The second fixing element 7 can be a cylindrical body or a cone body. To assembling the component with the holder 5, the second fixing element 7 of the holder 5 is connected with the fixing hole 62 on the first fixing element 6 of the circuit board 4. The illuminant device of the present invention further includes a housing 8 for accommodating a plurality of holders 5 as shown in FIG. 11. Each holder 5 has a hole 51 for positioning the LED 2. The holder 5 can be a bowl-shaped, semicircular, half-ellipse or square-pyramid structure for converging light.

In summary, the lamp of the illuminant device in the present invention has a lead with a protrusion, and a distance is provided between the protrusion and one end portion of the lead. Thus, the insertion depth of the lamp into the circuit board can be controlled. In addition, since the body has a plurality of connecting members or circuit boards, the lamps can be easily inserted into the connecting members or circuit boards by auto insertion method. Then, the wave soldering process can be performed to sufficiently and stably fix the lamps on the connecting members or circuit boards. Therefore, the present invention can fast and conveniently manufacture and assemble the stereo lamp structure without increasing the manufacturing cost and the component number.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A manufacturing method of an illuminant device, comprising steps of:
   providing a body with a plurality of connecting members, wherein each of the connecting members comprises a first circuit board;
   disposing a plurality of lamps on the connecting members, respectively, wherein each of the lamps comprises a light-emitting diode;
   separating the body with the light-emitting diodes into a plurality of assembling units, wherein each of the assembling units comprises only one of the light-emitting diodes and one of the first circuit boards;
   installing the assembling units on a carrier; and
   assembling the carrier with a holder, wherein the carrier comprises a second circuit board.

2. The method according to claim 1, wherein each of the light-emitting diodes is a tubular LED, a circular LED, a rectangular LED, a lamp type LED, a Piranha LED, a Snap LED or a SMD-type LED.

3. The method according to claim 1, wherein each of the light-emitting diodes comprises a lead and a protrusion, and the protrusion is directly formed on the lead or formed by bending the lead.

4. The method according to claim 3, wherein a distance is provided between the protrusion and an end portion of the lead for controlling an insertion depth of the lamp into the connecting member.

5. The method according to claim 1, wherein a connecting surface of the connecting member comprises a copper-clad surface to be connected with the carrier.

6. The method according to claim 1, wherein the carrier and the holder are assembled by a first fixing element.

7. The method according to claim 6, wherein the first fixing element comprises at least one fixing pin and at least one fixing hole.

8. The method according to claim 6, wherein the holder comprises a second fixing element assembled with the first fixing element.

9. The method according to claim 1, wherein the light-emitting diodes are fixed on the connecting member by a wave soldering process.

10. The method according to claim 1, wherein the holder is a bowl-shaped, semicircular, half-ellipse or square-pyramid structure for converging light, and the holder has a hole for positioning the lamp.

11. An illuminant device, comprising:
- a body having a plurality of connecting members, wherein each of the connecting members comprises a first circuit board;
- a plurality of light-emitting diodes disposed on the connecting members, respectively, wherein the body is separated into a plurality of assembling units, and each assembling unit comprises only one of the light-emitting diodes and one of the connecting members;
- a carrier for installing the assembling units thereon, wherein the carrier comprises a second circuit board; and
- a holder assembled with the carrier.

12. The illuminant device according to claim 11, being a vehicle lamp device.

13. The illuminant device according to claim 11, further comprising a housing for accommodating the holder.

14. The illuminant device according to claim 11, wherein each of the light-emitting diodes is a tubular LED, a circular LED, a rectangular LED, a lamp type LED, a Piranha LED, a Snap LED or a SMD-type LED.

15. The illuminant device according to claim 11, wherein each of the light-emitting diodes comprises a lead and a protrusion formed on the lead directly or formed by bending the lead, and a distance is provided between the protrusion and an end portion of the lead for controlling an insertion depth of the lamp into the connecting member.

16. The illuminant device according to claim 11, wherein a connecting surface of the connecting member is a copper-clad surface to be connected with the carrier.

17. The illuminant device according to claim 11, wherein the carrier and the holder are assembled by a first fixing element, and the holder comprises a second fixing element assembled with the first fixing element.

18. The illuminant device according to claim 11, wherein the holder is a bowl-shaped, semicircular, half-ellipse or square-pyramid structure for converging light, and the holder has a hole for positioning the lamp.

* * * * *